United States Patent
Alon et al.

(10) Patent No.: US 7,454,733 B2
(45) Date of Patent: Nov. 18, 2008

(54) INTERCONNECT-AWARE METHODOLOGY FOR INTEGRATED CIRCUIT DESIGN

(75) Inventors: Amir Alon, Ramat Ishai (IL); David Goren, Nesher (IL); Rachel Gordin, Hadera (IL); Betty Livshitz, Qiriat Yam (IL); Anatoly Sherman, Haifa (IL); Michael Zelikson, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/091,934

(22) Filed: Mar. 6, 2002

(65) Prior Publication Data

US 2003/0172358 A1 Sep. 11, 2003

(51) Int. Cl.
*G06F 17/50* (2006.01)

(52) U.S. Cl. ............ 716/10; 716/1; 716/8; 716/9; 716/11; 703/14

(58) Field of Classification Search ............ 716/1, 716/4–6, 8–14, 18; 333/1; 703/14–16, 19
See application file for complete search history.

(56) References Cited

U.S. PATENT DOCUMENTS

| | | | | |
|---|---|---|---|---|
| 5,025,402 A * | 6/1991 | Winkelstein | ............ | 703/14 |
| 5,031,111 A * | 7/1991 | Chao et al. | ............ | 716/7 |
| 5,379,231 A * | 1/1995 | Pillage et al. | ............ | 703/14 |
| 5,555,201 A * | 9/1996 | Dangelo et al. | ............ | 716/11 |
| 5,557,531 A * | 9/1996 | Rostoker et al. | ............ | 716/1 |
| 5,867,387 A * | 2/1999 | Kavana | ............ | 700/97 |
| 5,867,399 A * | 2/1999 | Rostoker et al. | ............ | 716/18 |
| 5,883,814 A * | 3/1999 | Luk et al. | ............ | 716/2 |
| 5,959,871 A * | 9/1999 | Pierzchala et al. | ............ | 703/4 |
| 6,099,580 A * | 8/2000 | Boyle et al. | ............ | 716/7 |
| 6,202,197 B1 * | 3/2001 | Robinson et al. | ............ | 716/17 |
| 6,205,571 B1 * | 3/2001 | Camporese et al. | ............ | 716/2 |
| 6,286,128 B1 * | 9/2001 | Pileggi et al. | ............ | 716/18 |
| 6,295,635 B1 * | 9/2001 | Dhaene et al. | ............ | 716/14 |
| 6,342,823 B1 * | 1/2002 | Dansky et al. | ............ | 333/1 |
| 6,360,191 B1 * | 3/2002 | Koza et al. | ............ | 703/6 |
| 6,367,051 B1 * | 4/2002 | Pileggi et al. | ............ | 716/2 |
| 6,381,563 B1 * | 4/2002 | O'Riordan et al. | ............ | 703/14 |
| 6,381,730 B1 * | 4/2002 | Chang et al. | ............ | 716/5 |
| 6,385,565 B1 * | 5/2002 | Anderson et al. | ............ | 703/18 |
| 6,453,444 B1 * | 9/2002 | Shepard | ............ | 716/2 |
| 6,467,069 B2 * | 10/2002 | Mehrotra et al. | ............ | 716/6 |
| 6,476,771 B1 * | 11/2002 | McKinzie, III | ............ | 343/756 |
| 6,496,972 B1 * | 12/2002 | Segal | ............ | 716/18 |
| 6,539,531 B2 * | 3/2003 | Miller et al. | ............ | 716/15 |
| 6,557,145 B2 * | 4/2003 | Boyle et al. | ............ | 716/2 |

(Continued)

OTHER PUBLICATIONS

R. Beale et al., "Design Methodology and Simulation Tools for Mixed Analog-Digtal Integrated Circuits", IEEE International Systems On Circuits and Systems, pp. 1351-1355, May, 1990.*

(Continued)

*Primary Examiner*—Jack Chiang
*Assistant Examiner*—Naum B Levin

(57) ABSTRACT

An integrated circuit design kit including one or more circuit components topologies, and one or more critical interconnect lines topologies. The interconnect line topologies may be predefined. The kit may further include one or more circuit components models and one or more critical interconnect lines models.

2 Claims, 5 Drawing Sheets

U.S. PATENT DOCUMENTS

| | | | | |
|---|---|---|---|---|
| 6,564,194 | B1* | 5/2003 | Koza et al. | 706/13 |
| 6,564,355 | B1* | 5/2003 | Smith et al. | 716/4 |
| 6,625,677 | B1* | 9/2003 | Iqbal | 710/100 |
| 6,643,831 | B2* | 11/2003 | Chang et al. | 716/4 |
| 6,665,849 | B2* | 12/2003 | Meuris et al. | 716/7 |
| 6,704,179 | B2* | 3/2004 | Voldman | 361/56 |
| 6,760,900 | B2* | 7/2004 | Rategh et al. | 716/19 |
| 6,834,375 | B1* | 12/2004 | Stine et al. | 716/2 |
| 2002/0095648 | A1* | 7/2002 | Saito | 716/10 |
| 2002/0104063 | A1* | 8/2002 | Chang et al. | 716/4 |
| 2002/0116696 | A1* | 8/2002 | Suaya et al | 716/6 |
| 2003/0131334 | A1* | 7/2003 | Suaya et al. | 716/12 |
| 2003/0149962 | A1* | 8/2003 | Willis et al. | 717/135 |
| 2004/0148578 | A1* | 7/2004 | McConaghy et al. | 716/1 |
| 2004/0172609 | A1* | 9/2004 | Hassibi et al. | 716/18 |

OTHER PUBLICATIONS

Goren et al. "An interconnect-aware methodology for analog and mixed signal design, based on high bandwidth (over 40 GHz) on-chip transmission line approach", Design, Automation and Test in Europe Conference and Exhibition, 2002. Proceedings Mar. 4-8, 2002 pp. 804-811.*

Tsividis Yannis. "Mixed analog-digital VLSI devices and technology", 1995, pp. 1-284.*

Thor A. Larsen "Mixed analog-digital VLSI devices and technology" By Yannis Tsividis (brief description), World Scientific, 2002, pp. 39-40.*

Siomacco et al., "Parametric modeling of integrated circuit interconnections", Circuits and Systems II: Analog and Digtal Signal Processing, IEEE vol. 39, Issue 6, Jun. 1992 pp. 377-382.*

Un, M. et al., "Calculation of delay and rise times for uniformly distributed RLC line". Electrotechnical Conference, 1998. MELECON 98., 9th Mediterranean, vol. 1, May 18-20, 1998 pp. 604-607.*

* cited by examiner

[ZZZ] SIGNAL WIRE    [XXX] SHIELDING

[ZZZ] SIGNAL WIRE    [XXX] SHIELDING    [ ] VIA

[ZZZ] SIGNAL WIRE    [XXX] SHIELDING

INTERCONNECT-AWARE METHODOLOGY FOR INTEGRATED CIRCUIT DESIGN

FIELD OF INVENTION

This invention relates generally to integrated circuit design, and in specific to analog and mixed signal (AMS) design of on-chip transmission lines.

BACKGROUND

The recently introduced SiGe BiCMOS technology enables a tremendous increase in on-chip signal bandwidth in the areas of analog and mixed signal (AMS) design. Undoubtedly, the increased bandwidth capability has created new chip design challenges.

FIG. 1 is a flow chart of prior art integrated circuit design flow. As is common in AMS design practice, a designer starts with an architecture and floor plan definitions stage 12. During stage 12, the project is defined on the system level, which means that major design blocks and their locations may be determined.

Next is the schematic design stage 14, wherein a schematic of the design is drawn up. In schematic stage 14, the design components such as transistors and resistors may be defined, and may be connected by ideal wires. Typically at this stage, the wires and connections may be defined without considering the wire delay, signal distortion across the wire, etc.

During a physical design stage 16, the actual physical location (e.g. layout) of the components and wires on the silicon is defined. Next is a post layout extraction stage 18, wherein an automatic approximate calculation may be performed for the wire non-ideal properties, which usually includes wire capacitance to ground, and in some instances, also for the cross capacitance between wires as well as the wire resistance. In other instances, the wire inductance may also be extracted. In the final stage, simulation 20, all elements, including the extracted wire parameters from stage 18, are simulated and compared to the original design requirements.

If the results of simulation 20 are slightly different from the design requirements, the designer may return to stage 16, repeating that stage and the following stages. However, if the results of simulation 20 are much different from the required results, which may happen, especially with high speed designs, the designer may not be able to salvage the physical design, and may find that it is easier and less time consuming to redesign the system, rather than try and modify the existing design. In this case, the designer may find himself returning to stage 14, and having to perform an almost total redesign.

In order to avoid such time-wasting efforts, it is the practice of highly experienced designers to try and somehow estimate the impacts of the main interconnects already in schematic design stage 14. In multi-GHz design regimes, on-chip interconnects may have a major impact on an integrated circuit (IC) performance, and produce thereto large time delays, overshoots, ringing effects, dispersion, etc. The common practice is therefore to try, during the extraction stage 18, to estimate the delay produced by the interconnect, and thus compensate for the interconnect impact. There have been partial successes in estimating the and capacitance (C) and resistance (R) effect, however, disappointingly, it has proved very difficult to estimate the inductance (L) effect, and the cross-capacitance (xC) effect, since an accurate extraction of the inductance requires the knowledge of the return path current for each wire, which is impossible at post layout stage without making very simplifying assumptions that lead to large errors. In multi-GHz designs, the inductance effect has proven to have a large impact, and traditional post-layout treatment of on-chip interconnects still leads to either numerous design iterations and consequently to longer time-to-market, or to a significant amount of over-design. There therefore exists a need to provide efficient and effective AMS design methodology.

SUMMARY

In continuation of the discussion from the Background, in integrated circuit or specifically chip design in the high speed AMS domain is characterized by a frequent need for true-transient time-domain simulations, high importance of signal integrity, and characteristic bandwidths in the microwave region. In prior art design flows, the typical layout is relatively sparse, with is usually not well-defined impedance environment and a basically serial design flow (e.g. layout after schematic).

Due to these characteristics, the inventors of the present invention have invented an on-chip interconnect-aware AMS design flow. One embodiment of the present design flow incorporates interconnect influences into the standard design procedure, and thus, may account for transmission line phenomena, which abound at such high bandwidths. As such, a preferred embodiment of the present invention may provide an on-chip interconnect-aware design flow adaptable for high-speed AMS applications.

The inventors of the present invention have further provided an additional embodiment of the present invention that differentiates between critical interconnect lines, and not critical interconnect lines, an issue which has largely been ignored by prior art design flows.

Additionally noted, prior art microwave design flows address the issue of interconnect modeling in the frequency domains, and do not fully develop the issue of interconnect modeling in the time domain. Furthermore, prior art AMS design flows have also not adequately developed time domain interconnect models at high bandwidths, and as such, this is addressed in an embodiment of the present invention.

There is therefore provided, in accordance with an embodiment of the present invention, a method for designing integrated circuits (IC). The integrated circuits may be either analog and mixed signal (AMS) circuits or application specific integrated circuits (ASIC).

The method includes defining a chip architecture and a floor plan, identifying one or more critical interconnect lines, and defining transmission line topologies for design of the critical interconnect lines. Next a schematic design of the IC may be determined and a physical layout of the IC may be defined. Further the electrical parameters of the layout may be extracted and the schematic design is simulated. The method may also include receiving the results of the simulation, and comparing the simulation results to a set of initial design requirements. According to the results, the steps commencing with determining a schematic design may be repeated.

The method may include choosing from a set of predefined parameterized topologies or defining a set of topologies. The schematic design may include models of the one or more transmission line topologies. The electrical parameters of the models may be calculated. The electrical parameters may include capacitance, low frequency inductance, high frequency inductance, low frequency series resistance, high frequency series resistance, TEM impedance, and matrix representations of one or more of the parameters.

Estimated length, metal level assignment and manual user selection may be used to identify the critical interconnect lines. Parameterized cells may be created from the models.

There is therefore provided, in accordance with an embodiment of the present invention, a method for designing integrated circuits wherein defining the chip architecture and a floor plan includes defining critical interconnect wires.

There is therefore provided, in accordance with an embodiment of the present invention, a system for integrated circuit design. The system may include a high level design including a chip architecture, a floor plan, and one or more critical interconnect wire topologies, a schematic design, a physical layout, extracted and calculated parameters and simulation results.

The schematic design may include one or more circuit components and one or more critical interconnect wire models. The physical layout may include the circuit components and the critical interconnect wire topologies. The extracted parameters may be derived from the circuit components, and the calculated parameters may be of the critical interconnect wire models. The results may be from simulation of the schematic design, the extracted parameters and the calculated parameters.

There is therefore provided, in accordance with an embodiment of the present invention, an integrated circuit design kit including one or more circuit components topologies, and one or more critical interconnect lines topologies. The interconnect line topologies may be predefined. The kit may further include one or more circuit components models and one or more critical interconnect lines models.

There is therefore provided, in accordance with an embodiment of the present invention, a topology of critical interconnect lines, where in some cases, the topology is predefined. The topology may include a definite current return path wherein the sum of the currents of a cross section of the topology is zero. The topology may also include electrical parameters such as capacitance, low frequency inductance, high frequency inductance, low frequency series resistance, high frequency series resistance, TEM impedance, and matrix representations of one or more of the parameters.

The topology may include one or more signal wires and one or more shielding wires. The shielding wires may be side shielding wires located on the sides of the signal wires, and/or a bottom shielding wire. The shielding wires may be shielding layers.

There is therefore provided, in accordance with an embodiment of the present invention, a computer software product for designing an integrated circuit. The product may include a computer readable medium in which program instruction are stored, which instructions, when read by a computer, cause the computer to create a topology of critical interconnect lines. The product may further include a model of critical interconnect lines. There is alternatively provided a computer software product for creating a design kit, wherein the kit may include a topology of critical interconnect lines.

BRIEF DESCRIPTION

Embodiments of the invention will now be described, by way of example, with reference to the accompanying drawings, in which.

Figure 3A:
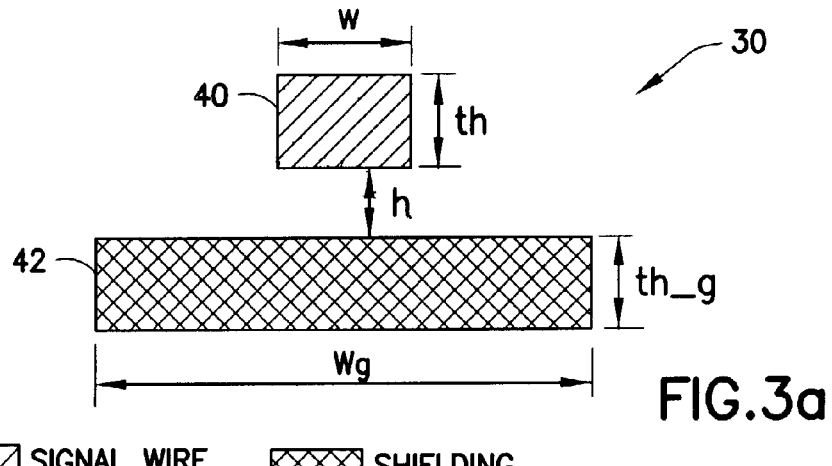
Figure 3B:
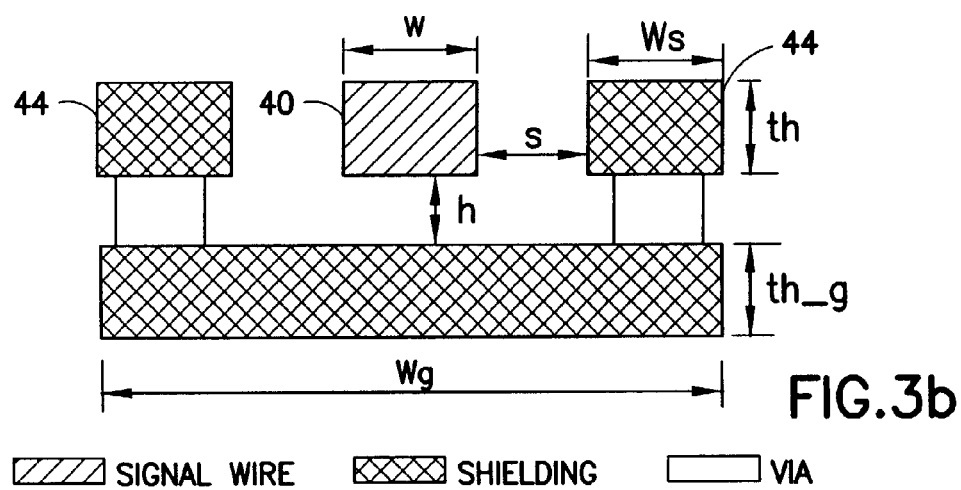
Figure 3C:
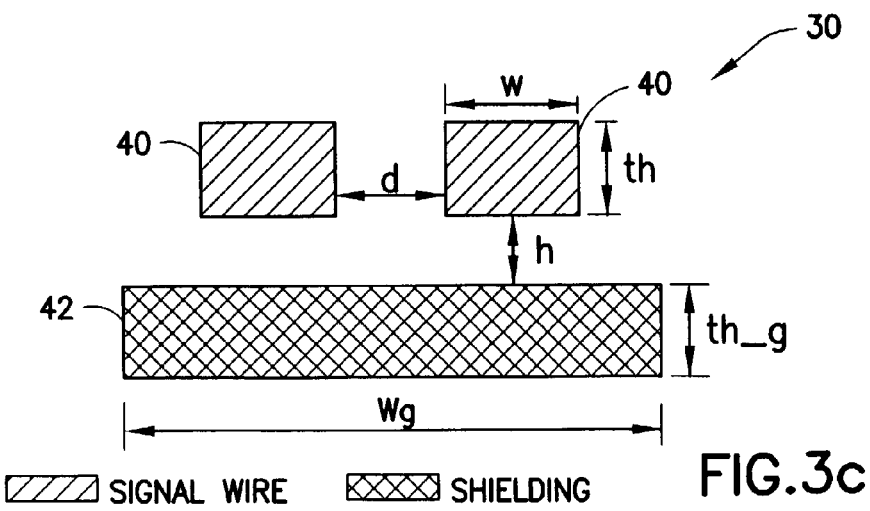
Figure 3D:
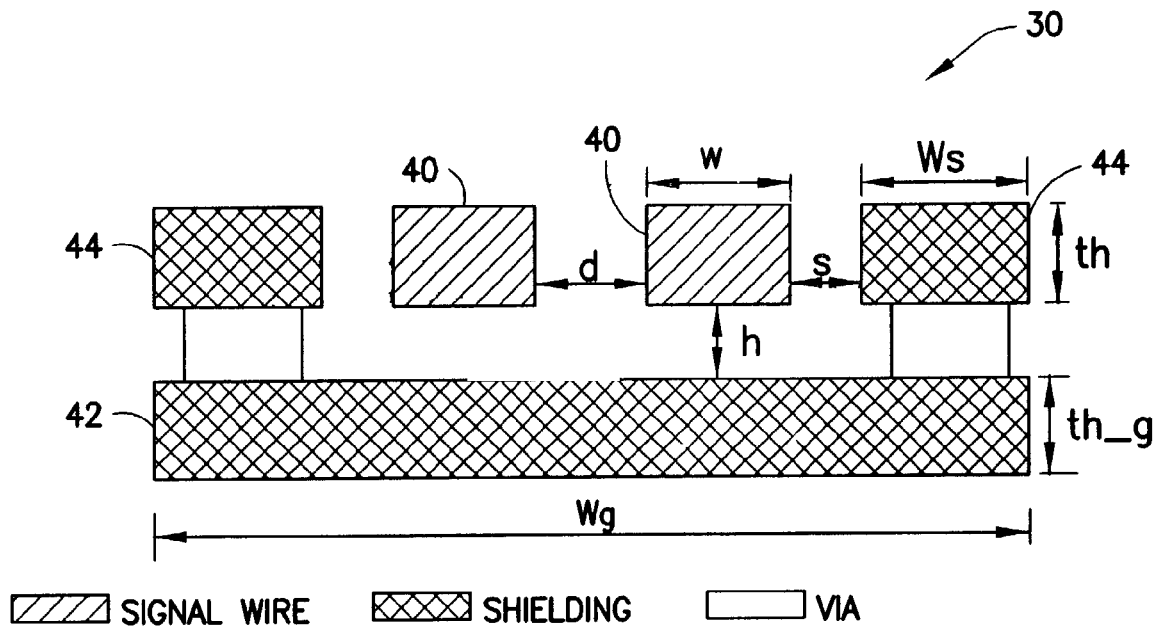
Figure 3E:
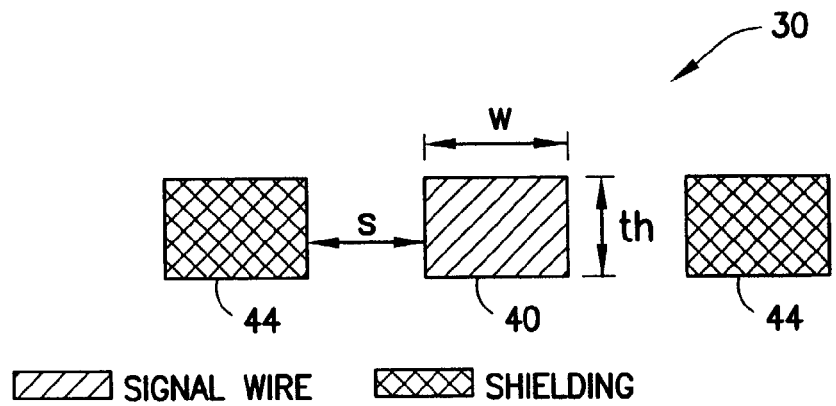
Figure 3F:
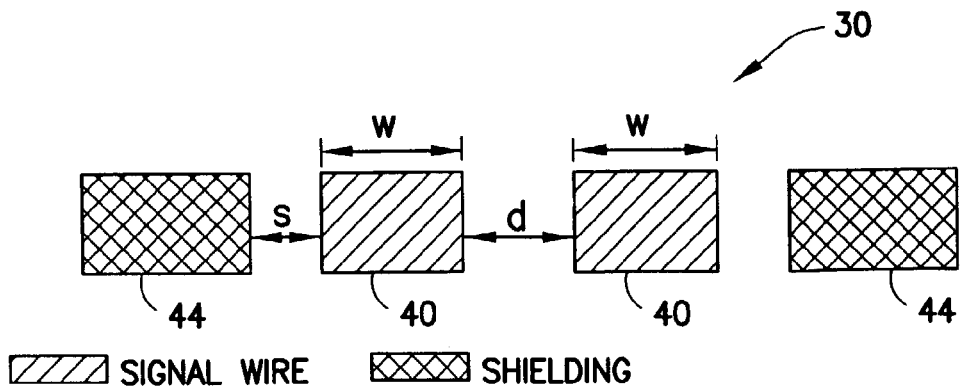
Figure 4:
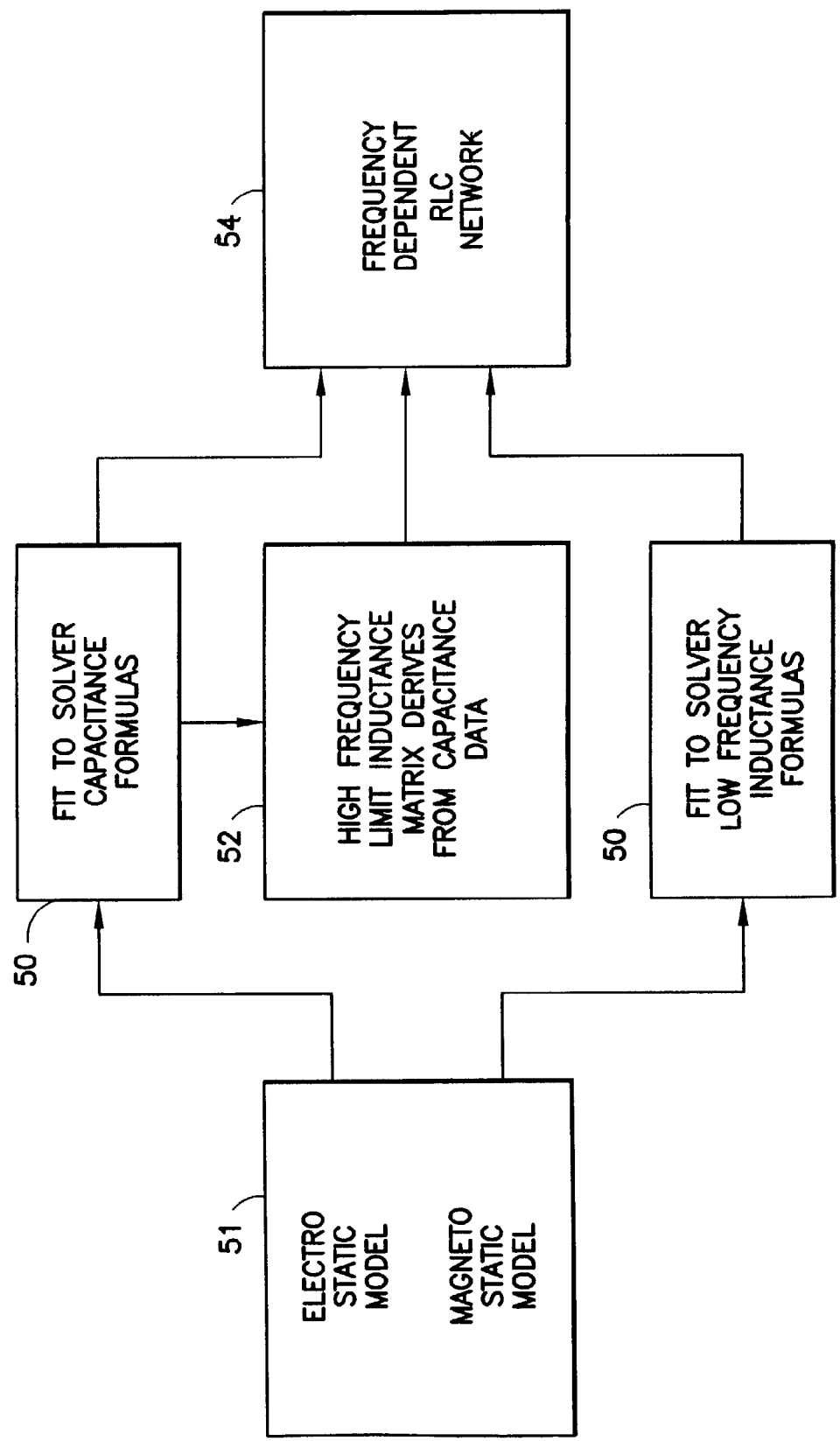

FIGS. 3(a)-(f) are illustration of examples of geometries for on-chip T-mode implementations constructed according to an embodiment of the present invention; and FIG. 4 is a flow chart illustrating one alternative embodiment of basic stages for calculating the RCL frequency network components of a critical transmission line.

DETAILED DESCRIPTION

The present invention is an integrated circuit, on-chip, interconnect-aware methodology, and associated apparatus which may be adaptable for enabling early incorporation of on-chip transmission line (T-line) components into high-speed analog and mixed signal (AMS) design flow.

For clarity purposes herein, it is noted that interconnect lines are wires connecting one or more active and passive components in a design. Some interconnect lines are critical, namely their non-ideal behavior has a large effect on performance, and other may not be. Transmission lines (T-lines) and T-line topologies are inventive, defined, geometric tools that may control the non-ideal behavior properties of the critical interconnect lines and model thereto.

Additionally noted, references herein to high frequency is defined as a a bandwidth wherein the inductance of the wires may have a high impact on the integrated circuit (IC) performance.

The present inventive interconnect-aware design methodology supports designing the critical interconnect lines from the very beginning, rather than extract them in post layout stages, as is common in prior art design flow. Critical interconnect lines may therefore be identified, modeled as T-lines and incorporated in a netlist from the early stages of the design flow, and their parameters may be updated as the design evolves towards maturity. By incorporating on-chip critical interconnect lines into the simulation via dedicated T-line topologies and models, the present process and apparatus may enable higher IC performance predictability for high speed designs.

A possible embodiment of the present invention may be to provide a set of parameterized T-line structures, or topologies, comprising one, two, or more, coupled microstrip lines with optional side shielding, accompanied by compact true transient models. The T-line topology set may be integrated within a design kit for a specific technology. The set may use and contain the relevant technology data, as a consistent manner with the implementation of other library elements. The allowed set of the T-line topologies may therefore be regarded as an integral part of the specific technology, and may be predefined for selection by the designer/user.

Figure 1:
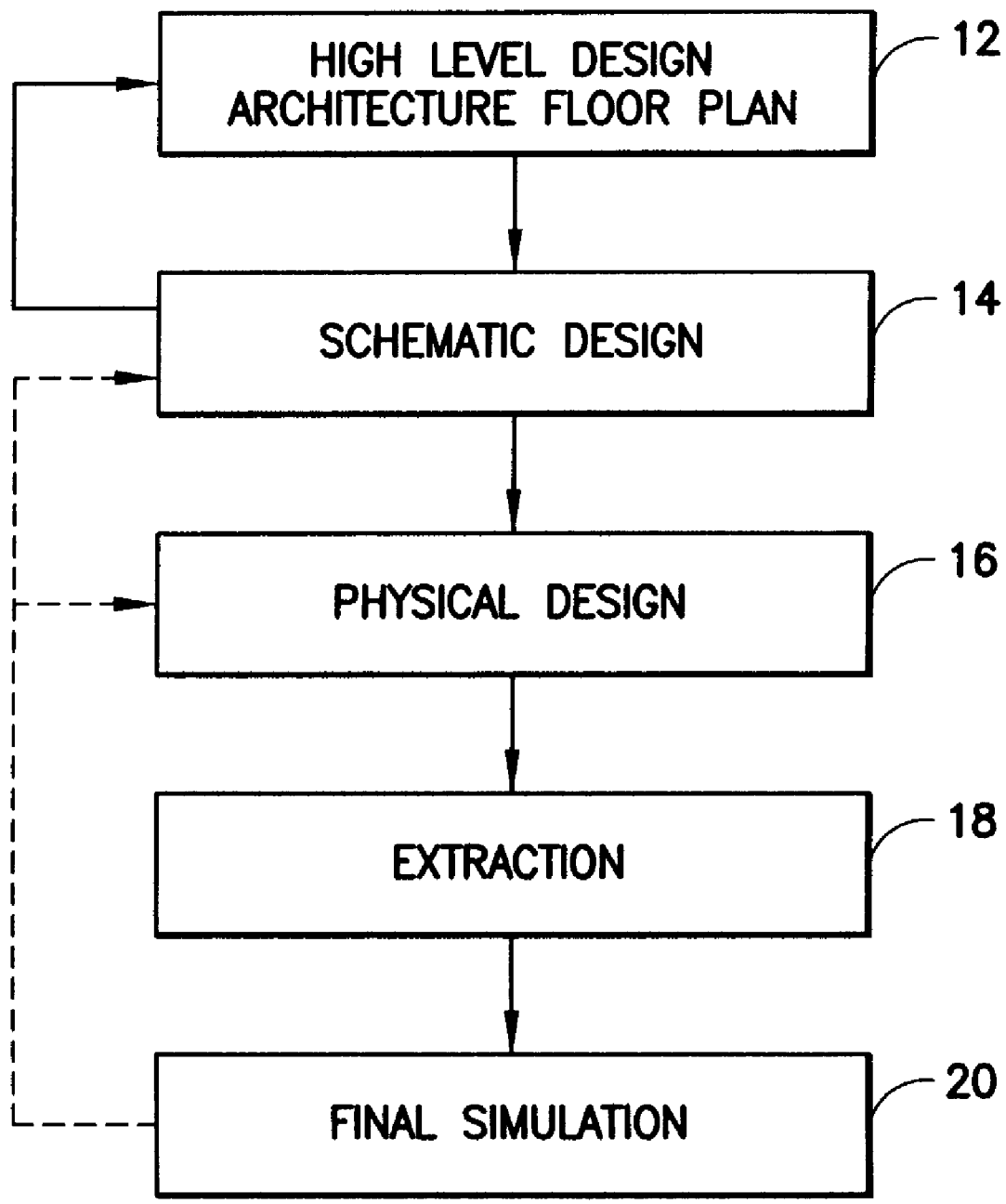
FIG. 1 is a flow diagram of an exemplary prior art design flow.
Figure 2:
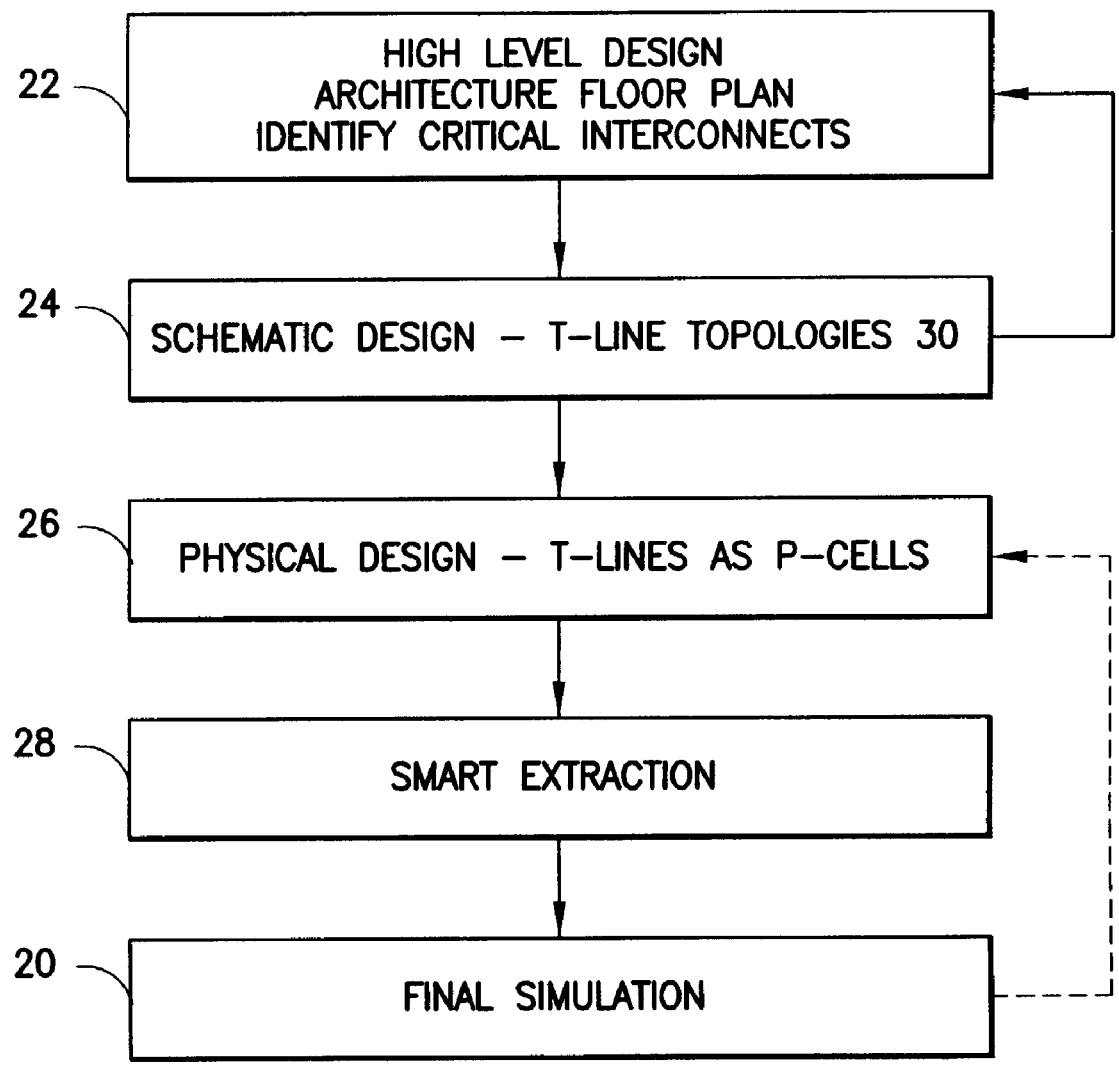
FIG. 2 is a flow diagram of a design flow, constructed and operated according to an embodiment of the present invention.

Reference is now made to FIG. 2, a flow chart of an interconnect aware design flow, constructed and operated according to an embodiment of the present invention. The flow chart of FIG. 2 comprises high level design stage 22, a schematic design stage 24, a physical design stage 26, a smart extraction stage 28 and final simulation stage 20.

Stage 22 starts with architecture and floorplan definitions. During stage 22, most of the critical interconnect lines to be modeled as on-chip T-line topologies 30 are identified and defined. The T-line topologies 30 may be a set of allowed structures modeling the critical interconnect lines. T-line topologies 30 will be described in detail in connection with FIG. 3.

It is noted that while most of the critical interconnect lines may be identified and modeled during stage 22, there may be critical interconnect lines which are identified and modeled at a later stage in the design.

In the present invention, it may be assumed that within the AMS domain only a limited set of signal lines produce significant transmission line effects, and only those critical lines must be accounted for by T-line components. This approach is similar to the general paradigm of critical parasitics selection, however, prior art design methods did not realize the significance of the proper design and early estimation of the interconnects, and addressed them only in later stages of design.

As is apparent to those skilled in the art, the selection of the critical interconnect lines may be based on many criteria, including the estimated length and metal level assignment. Typically these critical lines may be the longer high-speed lines. The number of critical lines is usually much lower than the total number of wires in a given design. It is noted that due to the much higher bandwidths experienced in high speed AMS designs as compared with conventional VLSI designs, the lines that may be modeled using T-line topologies 30 are typically much shorter, and may be in the order of few hundred microns.

As is additionally apparent to those skilled in the art of A&MS design, the choice of critical lines may also depend on the signal integrity and timing requirements from a given line, which is highly dependent on the specific application. The selection may also comprise the considerations for RC or RLC, or RLC with frequency dependent parameter models.

In this stage 22, the geometry of T-line topologies 30 may be defined, after which, an embedded algorithm may calculate the electrical parameters of the line, such as capacitance, low-and high-frequency inductance, series resistance, and impedance (odd and even impedances for coupled lines) at high frequency limit. It is noted, that in alternative embodiments parameterized topologies 30 may be predefined and available for selection.

Next is the schematic design stage 24 wherein a schematic is drawn up of the circuit elements. It is noted that in an embodiment of the present invention, T-line topologies 30 may be netlisted and simulated together with other circuit elements (like transistors, resistors etc.) and treated equally throughout the design process.

At the physical design stage 26, the actual physical location on the silicone chip (layout) of the components and wires is defined. Additionally, the on-chip T-line topologies 30 may be transferred into the layout view as parameterized cells (p-cells) correct by construction both from DRC and LVS points of view. During this stage 26, the actual lengths of the T-line topologies 30 may be slightly different from their schematic level designed values, and some stretching and bending may be required, along with possible refinement in the T-line topology 30 geometry parameters. A manual back-annotation of the T-line parameters to schematic is therefore recommended for the sake of maintaining identical schematic and layout views.

During the post-layout stage, e.g. smart extraction stage 28, wires modeled as T-line topologies 30 are recognized and treated as other library elements, namely their extracted geometrical parameters are transferred into the same model equations for post-layout simulation.

The rest of the wires are extracted and modeled only at this post-layout stage 28, using standard extraction techniques, which usually do not consider interconnect inductance at all, or consider it very roughly. As previously discussed, typically, standard extraction procedure, is much less accurate than the special treatment described above.

The complete netlist, combining both the T-line components and the layout-extracted components, may then simulated (simulation stage 20) to complete a bottom-up verification of the design process. Stage 20 may then compare the simulated results with the original design requirements and produce degree of merit of the design. A correct choice of critical interconnect lines in the previous design stages may increase the possibility for a one-iteration success.

It is noted, as above, that it may also be possible that additional lines are identified as critical at a later stage of the design, and their corresponding T-line topologies 30 are added into the simulation model. However, in most practical design examples, most of the critical lines can be identified at an early design stage.

Reference is now made to FIGS. 3(a)-(f), block diagrams illustrating examples of T-line topologies 30. T-line topology 30 may be designed using a predefined parameterized set of allowed interconnect structures or geometries with variable dimensions. The basic feature of such a structure may be that most of the electric field lines and the current return path are contained within the structure boundary, which solves the problem of the otherwise unknown return path for the current. FIGS. 3(a)-(f) present examples of possible generic geometries of T-line topologies 30, wherein FIGS. 3(a) (d) are microstrip topologies and FIGS. 3(e) (f) are coplanar topologies.

A preferred embodiment of the present invention may use two metal layers, where a top metal layer, signal line 40 carries the signal and a bottom layer 42 serves as a current return path. Other embodiments may include other geometries as well, such as coplanar topologies in which the current return path is in the side shielding mode of the same metal layer of the signal line, or where the selection criterion may be the cost effectiveness of a structure in terms of performance, versus its cost from the layout point of view. As such, it is noted that other topologies such as no-shielded topologies, or tri-topologies are included within the principles of the present invention. The methodology described is therefore not limited to any specific on-chip T-line structure, however, preferably the structure may comply with the criteria defined as follows.

As mentioned before, a basic requirement for a qualified interconnect geometry may be a closed environment condition, e.g. the majority of electric field lines are closed within the structure cross section. Hence, the T-line topology 30 may contain its own return path, namely, the sum of the currents in its cross section is zero.

Thus, the closed environment condition depends not only on the geometry, but also on the proper connectivity of the return path of the T-line in the circuit. This condition implies that both the electric and the magnetic coupling to nearby parallel lines are kept small, which may also solve the problem of the crosstalk from or to the critical lines.

As such, an embodiment of the present invention uses a bottom layer 42 or side wires as shielding. Bottom shielding may also eliminate the coupling to the conductive silicon substrate, consequently the substrate cross talk may be kept low. In general, shielding may also keep the line impedance well controlled. Other types of shielding such as a top shielding layer only, or both bottom and top shielding, or no shielding, are possible in other embodiments of this invention. As an example, in one embodiment two coupled lines carrying a differential signal may serve as the return paths for each other, without requiring any additional shielding, which may not be recommended due to the possible residual common mode signal.

Preferred embodiments of the present invention may be to provide two types of shielded structures: a single wire T-line topology 30 illustrated in FIGS. 3(a) and (c) and two coupled wire T-line topologies 30 illustrated in FIGS. 3(b) and (d), the latter being more suitable for differential designs. All possible metal layer combinations that are supported by the given technology may be used for signal and shielding. Another preferred embodiment is to provide also the additional coplanar geometries shown in FIGS. 3(e) and (f).

It is noted that in FIG. 3, w is the width of signal line 40, ws is the width of the side shielding 44, th is the thickness of signal line 40 and shielding 42, h is the distance between bottom shielding 42 and signal line 40, s is the distance between shielding 44 and signal line 40, d is the distance between the signal lines in a two coupled wire structure 40, wg and thg are the length and thickness of the bottom shielding 42, respectively.

In FIGS. 3(a) and (c), the width of the bottom return path layer 42 may be larger than the width of the signal line 40, in order to insure the closed environment condition. This shielding methodology may also reduce the inductance of the T-line topology 30 structure, thereby reducing many inductance related signal integrity problems in high-speed IC designs, such as overshoots, ringing noise, and even damped resonances in longer wires.

Both types of T-line topology 30 structures may provide a side shielding 44 of the signal line 40, as shown in FIGS. 3(b), (d), (e) and (f). In cases 3(b) and (d), stacked vias are connected between the side shielding 44 and the bottom shielding (layer 42), ensuring equal potential on the bottom and side shield, since the via-to-via separation is designed to be smaller than the shortest possible on-chip wavelength. This via connection is optional, and may not be needed in some instances.

As an additional example, in FIGS. 3(e) and (f) only side shielding is provided, thus allowing for extra design flexibility. This topology may be especially useful in CMOS high-density layout designs wherein the uses of the bottom shielding (FIGS. 3(a) (d)) may cause design difficulties.

At the present stage, the methodology forbids any metal shape collinear with the on-chip signal wire to be placed in higher metal layers right above it. However, this restriction may not be applied when the collinear higher line is far above the T-line signal wire. This restriction, and other restrictions, may follow from the introduction of T-lies into the design flow in order to allow for good design practice.

T-line models, as derived from the T-line topology 30, may be pure RLC (resistance, inductance, capacitance) in nature. In addition to that, the RLC networks representing the T-lines which are constructed and operated according to best embodiment of the present invention, account for frequency dependent skin and proximity effects, while maintaining passivity requirements. While one embodiment of the present embodiment supports an RLC model, with frequency dependent parameters it is noted that T-line topologies 30 may also support C, RC and RCL frequency independent models. T-line topologies 30 may also be modeled by direct time domain solutions of telegraph or Maxwell equations.

Calculation of the T-Line 30

Simulation of signal integrity in AMS and digital designs may include both time domain simulations and frequency domain simulations. Modeling of T-lines may be more readily achieved in the frequency domain, and thus, prior art methods typically simulated transmission lines in that domain.

In order to allow for time domain analysis, it is therefore common to use frequency domain simulations and translate them to the time domain using either the inverse fast Fourier transform or the inverse Laplace transform. Unfortunately, this method requires a periodic time domain excitation and does not allow for true transient simulation, namely having the system in one state and moving in time to another state without repetition, which may be highly desirable in AMS design practice.

One benefit of direct time domain simulations over the use of the above translation method (from frequency domain to time domain) is that time domain simulations inherently enable large signal simulation with nonlinear components, such as transistors, while frequency domain simulations, (and hence any translated time domain simulations from them), usually assume small or medium signal models (such as harmonic balance) for the transistors. Large signal simulations are essential in AMS designs that include switching circuits and power stages.

Another way to enable time domain simulations of circuits including on-chip T-lines is to solve Maxwell's equations (e.g. telegrapher equations) directly in time domain. This approach normally requires an electromagnetic field solver to be a built-in part of the design flow, implying various problems of convergence, stability, and time consuming process, even for medium size (several tenths of T-lines) designs, or it may require approximate mathematical formulation for lossy T-lines, which usually leads to sever passivity problems.

An embodiment of the present invention may incorporate on-chip T-line models, based on RLC ladder networks with frequency dependent parameters. Unlike many analytical time domain approximations, this approach is inherently passive by construction, and may be built to restore the frequency dependence of both the inductance and the resistance over the full bandwidth from DC to the transistor cut-off frequency (100 GHz for SiGe technology). The use of pure RLC networks enables further network reduction using standard techniques, such as AWE, CFH, or Krylov Subspace on the SPICE generated matrix, and may also be very convenient when considering the migration of the model to other circuit level simulation softwares.

By way of example only, the following is a sample method for calculating the components of a RLC network in a T-line model. A flow chart of such is illustrated in FIG. 4, to which reference is now made.

Each model of a T-line topology 30 may consist of several RLC segments built from fixed elements, arranged in such a way that the total inductance and resistance are frequency dependent. The calculation of the values of the RLC network components may includes several steps, which are given below.

In the first step (step 50), from an electrostatic and magneto-static model 51, the static (low frequency) values of the RLC parameters of the T-Line topology 30, per unit length, are calculated. The static resistance calculation is obvious in rectangular cross sections, unless cheesing holes appear in the copper lines, which requires the development of approximate resistance expressions. Several approaches are reported in the literature for modeling of low frequency line capacitance and inductance in rectangular geometries by expressions.

As an example, closed form, semi-analytical expressions were developed for the specific case of the T-line topology 30 structures of FIG. 3. The models comply with basic electrostatic and magneto-static principles and have correct asymptotic behavior with about 10% error (with respect to EM solver) in the entire usable geometry parameter range. This level of precision complies with the T-Line impedance variations in a typical silicon process due to the technology process variations. In addition, a 10% variation in RLC data usually causes insignificant deviations in the time domain simulated waveform shapes.

In the second step of the calculation (step 52), the high frequency limit transverse electromagnetic (TEM) inductance matrix may be calculated from the capacitance data, making use of quasi-TEM approximation, which holds up high frequencies in closed environment topologies, such as those shown in FIG. 3.

In the third step (step 54), these boundary RLC values may be used to calculate the actual values in a reduced RLC network, in a way that correctly describes the T-line topology 30 behavior across the whole frequency range of interest.

The algorithm embedded in each on-chip T-Line component receives the geometry parameters w, s, d and layer selection (as shown in FIG. 3) and constructs the equivalent RLC network described above, which is then used by a circuit-level simulator. The geometry parameters w, s, d and layer selection may typically be user input parameters, and may be determined by several design constraints, in the same manner of the selection of critical wires.

The accuracy of the RLC models may be at least within the expected process variation of line impedance in silicon based metalization, which is usually about 10%. The use of quasi-TEM approach for high bandwidth on-chip T-Line models is justified in topologies satisfying the closed environment condition by the fact that the cross sectional dimensions of the on chip T-Line structures, shown in FIG. 3, are few microns at the most, and are very small compared with the shortest on-chip wavelength, even at very high bandwidths.

The approach of identifying the critical lines in a design, designing them using a predefined parameterised set of topologies, may be applied to other relevant integrated circuit design niches. The other design niches may include Application Specific Integrated Circuits (ASIC), Silicon On Chip (SOC), and/or Very Large Scale Integration (VLSI). An example of an additional topology is a set of coplanar lines with a parametrically defined environment.

It will be appreciated by persons skilled in the art that the present invention is not limited by what has been particularly shown and describe herein above. Rather, the scope of the invention may be defined by the claims that follow:

The invention claimed is:

1. A method for modeling a transmission line topology selectable as a design element for a critical interconnect line of an integrated circuit being designed, wherein the integrated circuit is modeled using said critical interconnect lines before the physical layout of the integrated circuit is determined, said critical interconnect line being defined by a set of geometry parameters and capable of carrying analog and mixed signals, wherein said transmission line topology comprises signal return paths therein, the method comprising:

calculating low frequency RLC values per unit length, wherein the low frequency values are calculated using a model complying with electrostatic and magnetostatic principles for a geometry parameter range;

calculating high frequency RLC values per unit length, wherein a high frequency limit transverse electromagnetic inductance matrix is calculated from the capacitance using a quasi transverse electromagnetic mode (quasi-TEM) approximation; and calculating actual RLC values for a reduced RLC network by using the calculated low frequency RLC values and the calculated high frequency RLC values, wherein the reduced RLC network correctly describes the behavior of said transmission line topology across a frequency range of interest; and constructing an equivalent RLC network for said transmission line topology using the set of geometry parameters and the reduced RLC network, such that the equivalent RLC network is used by a circuit-level simulator to model said critical interconnect lines.

2. A computer-readable storage device storing a program for causing a computer to execute a method for modeling a transmission line topology selectable as a design element for a circuit interconnect line of an integrated circuit being designed, wherein the integrated circuit is modeled using said critical interconnect lines before the physical layout of the integrated circuit is determined, said critical interconnect line being defined by a set of geometry parameters and capable of carrying analog and mixed signals, wherein said transmission line topology comprises signal return paths therein, said computer program product including:

computer usable program code for calculating low frequency RLC values per unit length, wherein the low frequency values are calculated using a model complying with electrostatic and magnetostatic principles for a geometry parameter range;

computer usable program code for calculating high frequency RLC values per unit length, wherein a high frequency limit transverse electromagnetic inductance matrix is calculated from the capacitance using a quasi transverse electromagnetic mode (quasi-TEM) approximation;

computer usable program code for calculating actual RLC values for a reduced RLC network by using the calculated low frequency RLC values and the calculated high frequency RLC values, wherein the reduced RLC network correctly describes the transmission line topology behavior across a frequency range of interest; and computer usable program code for constructing an equivalent RLC network for said transmission line topology using the set of geometry parameters and the reduced RLC network, such that the equivalent RLC network is used by a circuit-level simulator to model said critical interconnect lines.

* * * * *